United States Patent
Kweon et al.

(10) Patent No.: US 12,512,429 B2
(45) Date of Patent: Dec. 30, 2025

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Junyun Kweon, Suwon-si (KR); Yeongbeom Ko, Suwon-si (KR); Wooju Kim, Suwon-si (KR); Jungseok Ryu, Suwon-si (KR); Junho Yoon, Suwon-si (KR); Hwayoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 18/205,329

(22) Filed: Jun. 2, 2023

(65) Prior Publication Data
US 2023/0395547 A1 Dec. 7, 2023

(30) Foreign Application Priority Data
Jun. 2, 2022 (KR) .................. 10-2022-0067793

(51) Int. Cl.
H01L 23/00 (2006.01)
H10B 80/00 (2023.01)

(52) U.S. Cl.
CPC ............. *H01L 24/08* (2013.01); *H10B 80/00* (2023.02); *H01L 2224/08145* (2013.01)

(58) Field of Classification Search
CPC ........ H10B 80/00; H10B 41/27; H10B 43/27; H10B 41/30; H10B 43/30; H10B 41/50;
(Continued)

(56) References Cited

U.S. PATENT DOCUMENTS 8,241,961 B2 8/2012 Kim et al.
9,206,038 B2 12/2015 Jeong et al.
(Continued)

FOREIGN PATENT DOCUMENTS

DE 102020104180 A1 * 5/2021 ......... H01L 23/3185
JP 2012-186309 A 9/2012
(Continued)

OTHER PUBLICATIONS

Communication dated Oct. 15, 2025 issued by the Korean Intellectual Property Office in Korean Patent Application No. 10-2022-0067793.

*Primary Examiner* — Mamadou L Diallo
(74) *Attorney, Agent, or Firm* — Sughrue Mion, PLLC

(57) ABSTRACT

A semiconductor device includes a first chip structure including a wiring structure disposed on a circuit elements, and first bonding metal layers and a first bonding insulating layer on the wiring structure, an upper surface of the first chip structure having an edge region and an inner region surrounded by the edge region, a second chip structure disposed on an inner region of the upper surface of the first chip structure, and including second bonding metal layers respectively bonded to the first bonding metal layers, a second bonding insulating layer bonded to the first bonding insulating layer, and a memory cell layer on the second bonding metal layers and the second bonding insulating layer, an insulating capping layer disposed on an upper surface of the second chip structure and extending to the edge region, and a connection pad disposed on a region of the insulating capping layer.

20 Claims, 14 Drawing Sheets

(58) Field of Classification Search
CPC .......... H10B 43/50; H01L 2224/08145; H01L 25/0657; H01L 23/3171; H01L 23/4824; H01L 23/5226; H01L 24/08; H01L 23/3185; H01L 2225/06562
See application file for complete search history.

(56) References Cited

U.S. PATENT DOCUMENTS

| | | |
|---|---|---|
| 9,748,206 B1 * | 8/2017 | Huang .................. H01L 23/564 |
| 11,081,392 B2 | 8/2021 | Lu et al. |
| 11,088,041 B2 * | 8/2021 | Chen .................... H01L 25/0655 |
| 11,282,816 B2 * | 3/2022 | Yu ........................ H10B 12/315 |
| 2007/0057349 A1 | 3/2007 | Yang |
| 2019/0221557 A1 * | 7/2019 | Kim ........................ H01L 24/80 |
| 2020/0027509 A1 * | 1/2020 | Chen ....................... H01L 24/80 |
| 2020/0203329 A1 * | 6/2020 | Kanamori ............. H10D 88/00 |
| 2021/0082865 A1 * | 3/2021 | Baraskar ................ H10B 43/40 |
| 2021/0134694 A1 * | 5/2021 | Li ..................... H01L 21/76898 |
| 2021/0202436 A1 | 7/2021 | Yeh et al. |
| 2021/0210460 A1 | 7/2021 | He |
| 2021/0265313 A1 * | 8/2021 | Chen .................. H01L 23/5223 |
| 2021/0313281 A1 * | 10/2021 | Kaminaga .............. H10B 43/10 |
| 2022/0093567 A1 * | 3/2022 | Kim ........................ H01L 24/48 |
| 2023/0083392 A1 * | 3/2023 | Hosomura ............. H10B 43/10 257/314 |
| 2023/0197552 A1 * | 6/2023 | Sikka .................. H01L 23/3675 257/668 |
| 2023/0368818 A1 * | 11/2023 | Tagami .................. H10B 43/40 |

FOREIGN PATENT DOCUMENTS

| | | |
|---|---|---|
| KR | 10-0665202 B1 | 1/2007 |
| KR | 10 2021 0065832 A | 6/2021 |
| KR | 10 2022 0040537 A | 3/2022 |

* cited by examiner

SEMICONDUCTOR DEVICE AND METHOD OF MANUFACTURING THE SAME

CROSS-REFERENCE TO RELATED APPLICATION(S)

This application is based on and claims priority under 35 U.S.C. § 119 to Korean Patent Application No. 10-2022-0067793 filed on Jun. 2, 2022 in the Korean Intellectual Property Office, the disclosure of which is incorporated by reference herein in its entirety.

BACKGROUND

1. Field

The present disclosure relates to a semiconductor device and a method of manufacturing the semiconductor device.

2. Description of Related Art

Demand for portable devices has rapidly increased in the electronics market. Therefore, miniaturization and weight reduction of electronic components mounted on such products are continuously required. For miniaturization and weight reduction of electronic components, an improvement in the degree of integration of semiconductor devices employed in electronic components is also required.

SUMMARY

Provided are a semiconductor device and a method of manufacturing a semiconductor device in which integration may be improved while significantly reducing defects during a cutting process.

According to an aspect of an example embodiment, a semiconductor device includes: a first chip structure including a substrate, circuit elements disposed on the substrate, a wiring structure disposed on the circuit elements, first bonding metal layers disposed on the wiring structure, and a first bonding insulating layer disposed on the wiring structure and surrounding side surfaces of the first bonding metal layers, an upper surface of the first chip structure having an edge region and an inner region surrounded by the edge region; a second chip structure disposed on the inner region of the upper surface of the first chip structure, the second chip structure including second bonding metal layers respectively bonded to the first bonding metal layers, a second bonding insulating layer surrounding side surfaces of the second bonding metal layers and bonded to the first bonding insulating layer, and a memory cell layer disposed on the second bonding metal layers and the second bonding insulating layer, and including memory cells; an insulating capping layer disposed on an upper surface of the second chip structure and extending to the edge region of the first chip structure along a side surface of the second chip structure; and a connection pad disposed on a region of the insulating capping layer on the upper surface of the second chip structure, and electrically connected to the memory cells.

According to an aspect of an example embodiment, a semiconductor device includes: a first chip structure including a substrate, a first device layer disposed on the substrate and having first circuit elements, a first wiring structure disposed on the first device layer, first bonding metal layers disposed on the first wiring structure, and a first bonding insulating layer disposed on the first wiring structure and surrounding side surfaces of the first bonding metal layers, an upper surface of the first chip structure having an edge region having a width in a range of 5 μm to 50 μm and an inner region surrounded by the edge region; a second chip structure disposed on the inner region of the upper surface of the first chip structure, the second chip structure including second bonding metal layers respectively bonded to the first bonding metal layers, a second bonding insulating layer surrounding side surfaces of the second bonding metal layers and bonded to the first bonding insulating layer, a second wiring structure disposed on the second bonding metal layers and the second bonding insulating layer, and a second device layer disposed on the second wiring structure and having second circuit elements; a protective insulating layer disposed on an upper surface of the second chip structure and having an extended portion extending to the edge region of the first chip structure along a side surface of the second chip structure; and a connection pad disposed in a region of the protective insulating layer located on the upper surface of the second chip structure, the connection pad being electrically connected to the second circuit elements.

According to an aspect of an example embodiment, a semiconductor device includes: a first chip structure including a substrate, circuit elements disposed on the substrate, a wiring structure disposed on the circuit elements, first bonding metal layers disposed on the wiring structure, and a first bonding insulating layer disposed on the wiring structure and surrounding side surfaces of the first bonding metal layers; a second chip structure disposed on the upper surface of the first chip structure, the second chip structure including second bonding metal layers respectively bonded to the first bonding metal layers, a second bonding insulating layer surrounding side surfaces of the second bonding metal layers and bonded to the first bonding insulating layer, and a memory cell layer disposed on the second bonding metal layers and the second bonding insulating layer and having memory cells; an insulating capping layer disposed on an upper surface of the second chip structure; and a connection pad disposed on a region of the insulating capping layer and electrically connected to the memory cells, wherein at least one side of side surfaces of the first chip structure is offset from a corresponding side of side surfaces of the second chip structure.

According to an aspect of an example embodiment, a method of manufacturing a semiconductor device, the method including: providing a first substrate structure divided into a plurality of first chip regions, the first substrate structure including a first wafer, a first device layer disposed on the first wafer, a wiring structure disposed on the first device layer, and a first bonding structure disposed on the wiring structure and including first bonding metal layers and a first bonding insulating layer surrounding the first bonding metal layers; providing a second substrate structure divided into a plurality of second chip regions corresponding to the plurality of first chip regions, the second substrate structure including a second wafer, a second device layer disposed on the second wafer, a second wiring structure disposed on the second device layer, and a second bonding structure disposed on the second wiring structure and including second bonding metal layers and a second bonding insulating layer surrounding the second bonding metal layers; partially separating the second substrate structure into the plurality of second chip regions by cutting the second bonding structure, the second wiring structure and the second device layer; bonding the second substrate structure to the first substrate structure by bonding the second bonding metal layers and the second bonding insulating layer to the first bonding metal layers and the first bonding insulating layer, respectively; exposing a surface of the second device layer by removing the second wafer from the second substrate structure; forming a connection pad on an exposed surface of the second device layer; and after forming the connection pad, separating the first substrate structure into the plurality of first chip regions.

BRIEF DESCRIPTION OF DRAWINGS

The above and other aspects, features, and advantages of certain embodiments of the present disclosure will be more clearly understood from the following description, taken in conjunction with the accompanying drawings, in which.

DETAILED DESCRIPTION

Figure 1:
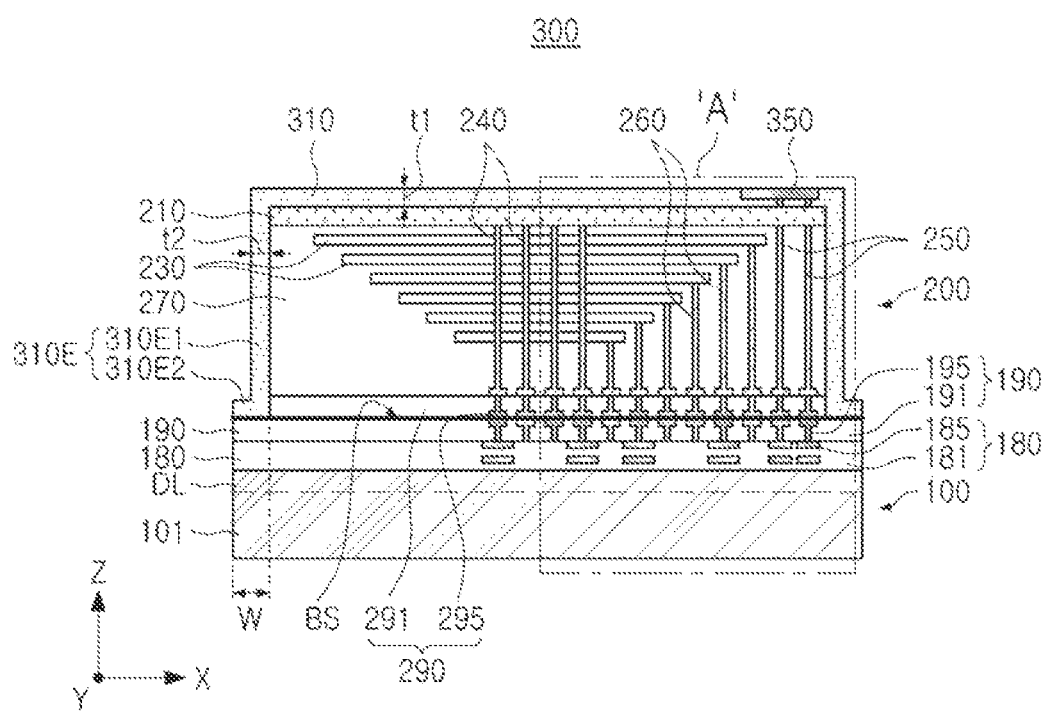
FIG. 1 is a side cross-sectional view illustrating a semiconductor device according to an example embodiment.

Hereinafter, example embodiments will be described with reference to the accompanying drawings. FIG. 1 is a side cross-sectional view illustrating a semiconductor device according to an example embodiment, and FIG. 2 is a partially enlarged view illustrating a portion ("A") of the semiconductor device illustrated in FIG. 1.

Figure 2:
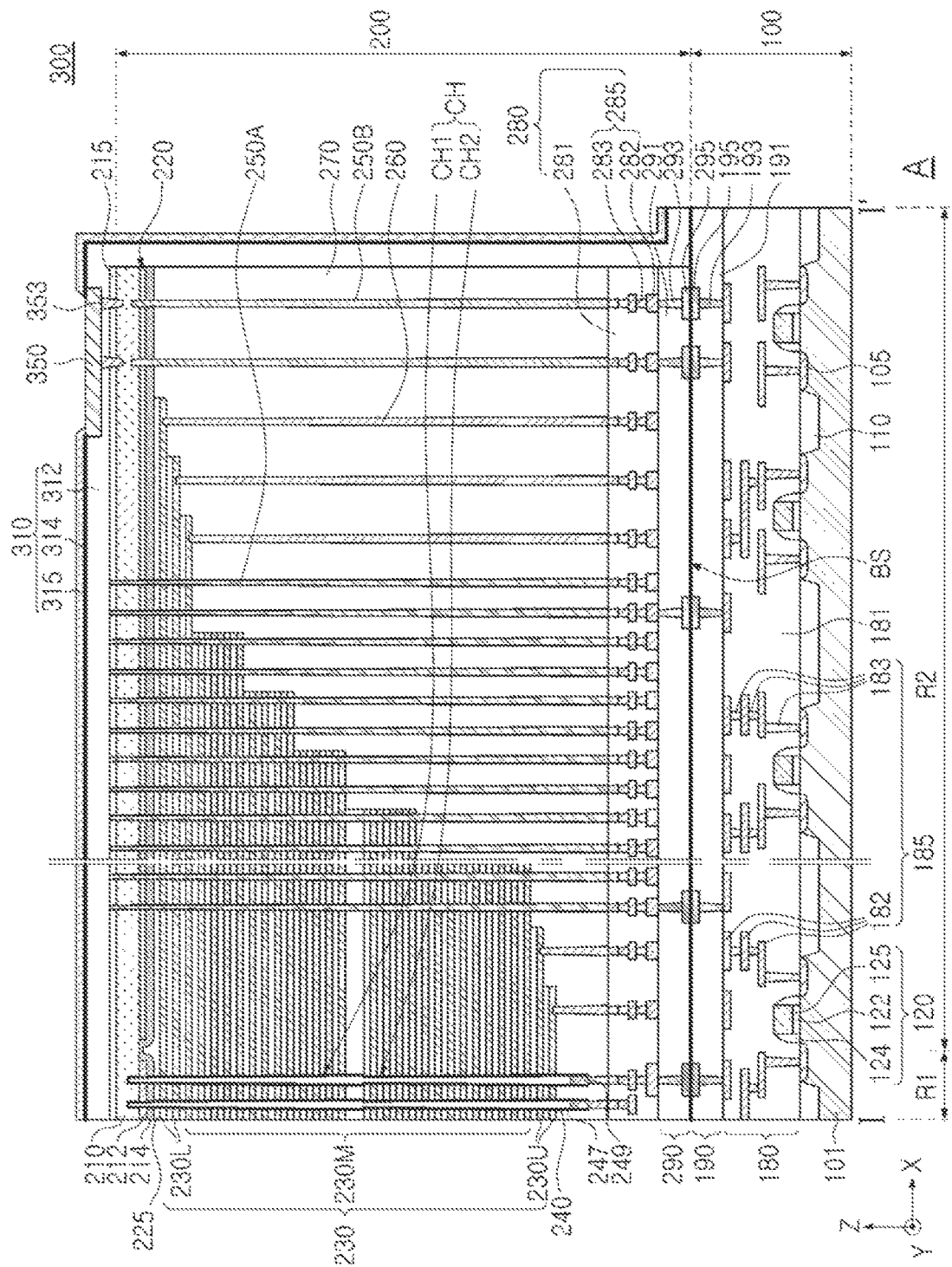
FIG. 2 is a partially enlarged view illustrating a portion ("A") of the semiconductor device illustrated in FIG. 1.

Referring to FIGS. 1 and 2, a semiconductor device 300 according to an example embodiment may include a first chip structure 100, and a second chip structure 200 disposed on the first chip structure 100 and having a lower surface bonded to an upper surface of the first chip structure 100.

In this embodiment, the first chip structure 100 may be a lower chip having a device layer DL, and the second chip structure 200 may be an upper chip having memory cells. The upper surface of the first chip structure 100 has an edge region and an inner region surrounded by the edge region. The second chip structure 200 may be disposed on an inner region of the upper surface of the first chip structure 100. The edge region may be determined by a cut width Kf obtained by cutting in advance, before the second chip structure 200 (e.g., the second substrate structure 200W in FIG. 7) is bonded to the first chip structure 100 (e.g., the first substrate structure 100W in FIG. 7). For example, the width W of the edge region may be in the range of 5 μm to 50 μm. As another example, the width W of the edge region may be in the range of 10 μm to 30 μm.

The protective insulating layer 310 is disposed on the upper surface of the second chip structure 200, and the connection pad 350 may be formed on the protective insulating layer 310 to be electrically connected to the memory cells (e.g., the plate layer 210). In this embodiment, the protective insulating layer 310 may have a portion 310E extending to the edge region of the first chip structure 100 along the side surface of the second chip structure 200. The thickness t1 of the protective insulating layer 310 may be smaller than the width W of the edge region. The thickness t2 of the protective insulating layer 310 located on the side surface of the second chip structure 200 may be smaller than the width W of the edge region. As a result, the extended portion 300E of the protective insulating layer 310 may have a first portion 310E1 extending in a direction (e.g., +Z-direction) perpendicular to the upper surface of the first chip structure 100 along a side surface of the second chip structure 200, and a second portion 310E2 extending in a direction parallel to the upper surface of the first chip structure 100 (e.g., −X-direction) along an edge region of the first chip structure 100.

The semiconductor device according to the present embodiment may be a memory device in which memory cells are arranged in three dimensions, and the memory cell employed in the second chip structure may have a three-dimensional memory cell structure.

Referring to FIG. 1, the first chip structure 100 may include a substrate 101, a device layer DL disposed on the substrate 101, a first wiring structure 180 disposed on the device layer DL, and a first bonding structure 190 disposed on the first wiring structure 180.

The device layer DL employed in this embodiment may include source/drain regions 105 and device isolation layers 110 in the substrate 101, and circuit elements 120 disposed on the substrate 101, as illustrated in FIG. 2. The substrate 101 may have an upper surface extending in the X-direction and Y-direction. The substrate 101 may have an active region defined by the device isolation layers 110. Source/drain regions 105 doped with impurities may be disposed in the active region. The substrate 101 may include a semiconductor material, for example, a group IV semiconductor, a group III-V compound semiconductor, or a group II-VI compound semiconductor. For example, the substrate 101 may be provided as a single crystal bulk wafer.

In some embodiments, circuit elements 120 may include planar transistors. Each of the circuit elements 120 may include a circuit gate dielectric layer 122, spacer layers 124, and a circuit gate electrode 125. Source/drain regions 105 may be disposed in the substrate 101 at both sides of the circuit gate electrode 125.

The first wiring structure 180 may include a first wiring insulating layer 181 and a first wiring line 185 disposed on the first wiring insulating layer 181. The first wiring line 185 may include first wiring patterns 182 and a first wiring via 183 (also referred to as a 'contact plug') for interlayer connection. The first wiring line 185 may be connected to the circuit elements 120 through a first wiring via 183 (e.g., a contact plug).

The first bonding structure 190 may include first bonding metal layers 195 and a first bonding insulating layer 191 surrounding side surfaces of the first bonding metal layers 195. The first bonding metal layers 195 may be connected to the first wiring line 185 of the first wiring structure 180 through the first bonding vias 193. In some embodiments, the first bonding vias 193 have a cylindrical shape, and the first bonding metal layers 195 may have a line shape or a pad shape having a relatively large area. The first bonding vias 193 and the first bonding metal layers 195 may include a conductive material, for example, copper (Cu).

Upper surfaces of the first bonding metal layers 195 may have flat surfaces exposed to the upper surface of the first chip structure 100. The first bonding metal layers 195 may be configured such that an area required for bonding overlaps each other at a position corresponding to the second bonding metal layers 295 of the second chip structure 200. In some embodiments, the first bonding metal layers 195 may have an area substantially corresponding to the area of the second bonding metal layers 295. In addition, the first bonding vias 193 and the first bonding metal layers 195 may provide a path for electrical connection with the second chip structure 200. In some embodiments, some of the first bonding metal layers 195 may be provided for bonding without being connected to the first wiring line 185.

Referring to FIG. 2, the second chip structure 200 may include a second bonding structure 290 for bonding to the first chip structure 100, similarly to the first bonding structure 190 of the first chip structure 100, and the second bonding structure 290 may include second bonding metal layers 295 bonded to the first bonding metal layers 195, respectively, and a second bonding insulating layer 291 surrounding the side surfaces of the second bonding metal layers 295 and bonded to the first bonding insulating layer 191.

The second bonding metal layers 295 may have a flat surface exposed to the lower surface of the second chip structure 200. The second bonding metal layers 295 may be bonded and electrically connected to the first bonding metal layers 195 of the first chip structure 100. The second bonding vias 293 and the second bonding metal layers 295 may include a conductive material, for example, copper (Cu).

Similar to the first bonding insulating layer 191, the second bonding insulating layer 291 may provide dielectric-dielectric bonding with the second bonding insulating layer 291 of the second chip structure 200. The first bonding insulating layer 191 and second bonding insulating layer 291 may include, for example, at least one of SiO, SiN, SiCN, SiOC, SiON, and SiOCN.

As such, the first chip structure 100 and second chip structure 200 may have bonding interface BS bonded by bonding of the first bonding metal layers 195 and second bonding metal layers 295 and bonding of the first bonding insulating layer 191 and second bonding insulating layer 291. As described above, bonding of the first bonding metal layers 195 and second bonding metal layers 295 may be, for example, copper (Cu)-copper (Cu) bonding, the bonding of the first bonding insulating layer 191 and second bonding insulating layer 291, for example, a dielectric-dielectric bonding such as SiCN—SiCN bonding, and may also be referred to as "hybrid bonding".

The second bonding metal layers 295 may be electrically connected to memory cells (e.g., the vertical channel structure CH and the gate electrodes 230) through the second bonding vias 293. The second bonding vias 293 may be disposed under the second wiring structure 280 to be connected to the second wiring lines 285.

In this embodiment, the device layer DL of the second chip structure 200 may include a 3D memory cell structure and a molding insulating layer 270 surrounding the 3D memory cell structure.

Referring to FIG. 2, the memory cell structure of the second chip structure 200 may include a plate layer 210 having a first region R1 and a second region R2, first horizontal conductive layer 212 and second horizontal conductive layer 214 on the lower surface of the plate layer 210, gate electrodes 230 stacked on lower surfaces of the first horizontal conductive layer 212 and second horizontal conductive layer 214, interlayer insulating layers 225 stacked alternately with the gate electrodes 230, isolation regions extending in one direction through the gate electrodes 230, vertical channel structures CH disposed to pass through the gate electrodes 230 in the first region R1, first input/output contact structures 250A, and second input/output contact structures 250B disposed to pass through the plate layer 210 and the gate electrodes 230 in the second region R2. The second chip structure 200 may include a base insulating layer 215 on the upper surface of the plate layer 210.

The second chip structure 200 may further include a second wiring structure 280 located in the second area R2, gate contacts 260 connected to the gate electrodes 230, and second wiring lines 285 including cell contact plugs 283. The cell contact plugs 283 are structures connecting the layers and may have a cylindrical shape. The cell contact plugs 283 may have different lengths according to a connection target (position). The gate contacts 260, the cell contact plugs 283, and the cell wiring lines 282 may include, for example, tungsten (W), aluminum (Al), copper (Cu), tungsten nitride (WN), tantalum nitride (TaN), titanium nitride (TiN), or combinations thereof.

The first region R1 of the plate layer 210 is a region in which the gate electrodes 230 are vertically stacked and the channel structures CH are disposed, and may be a memory cell region in which memory cells are disposed. The second region R2 of the plate layer 210 may be a region in which the gate electrodes 230 extend to have different lengths, and may correspond to a connection region for electrically connecting the memory cells to the first chip structure 100. The second region R2 may be positioned at at least one end of the first region R1 in at least one direction, for example, the X-direction.

The plate layer 210 may have a structure that is continuously extended throughout the semiconductor device 300 as illustrated in FIG. 1. The plate layer 210 may include a conductive material. For example, the plate layer 210 may include a semiconductor material, for example, a group IV semiconductor, a group III-V compound semiconductor, or a group II-VI compound semiconductor. For example, the group IV semiconductor may include silicon, germanium, or silicon-germanium. The plate layer 210 may further include impurities. The plate layer 210 may be provided as a polycrystalline semiconductor layer such as a polycrystalline silicon layer or an epitaxial layer.

The first horizontal conductive layer 212 and second horizontal conductive layer 214 may be sequentially stacked and disposed on the lower surface of the first region R1 of the plate layer 210. The first horizontal conductive layer 212 may not extend to the second region R2 of the plate layer 210, and the second horizontal conductive layer 214 may extend to the second region R2. The first horizontal conductive layer 212 may function as a portion of a common source line of the semiconductor device 300, and in some embodiments, may function as a common source line together with the plate layer 210. The first horizontal conductive layer 212 surrounds the channel layer 240 and may be directly connected to the channel layer 240.

The second horizontal conductive layer 214 may contact the plate layer 210 in some regions in which the first horizontal conductive layer 212 and the horizontal insulating layer 220 are not disposed. The second horizontal conductive layer 214 may be bent to cover an end of the first horizontal conductive layer 212 or the horizontal insulating layer 220 in the partial regions to extend onto the lower surface of the plate layer 210.

The first horizontal conductive layer 212 and second horizontal conductive layer 214 may include a semiconductor material, and for example, both of the first horizontal conductive layer 212 and second horizontal conductive layer 214 may include polycrystalline silicon doped with impurities. In various embodiments, the material of the second horizontal conductive layer 104 is not limited to a semiconductor material, but may be replaced with an insulating layer.

The horizontal insulating layer 220 may be disposed on the lower surface of the plate layer 210 at a level overlapping the first horizontal conductive layer 212 in at least a portion of the second region R2. The horizontal insulating layer 220 is alternately stacked on the second region R2 of the plate layer 210, and may include first and second insulating layers made of different materials. For example, the horizontal insulating layer 220 may include silicon oxide, silicon nitride, silicon carbide, or silicon oxynitride. In various embodiments, the first insulating layers may be made of the same material as the interlayer insulating layers 225, and the second insulating layer may be made of a material different from that of the interlayer insulating layers 225.

The gate electrodes 230 may be vertically spaced apart and stacked on the lower surface of the plate layer 210 to form a stack structure together with the interlayer insulating layers 225. The stack structure is vertically stacked and may include lower and upper stack structures surrounding the first and second channel structures CH1 and CH2, respectively.

The gate electrodes 130 may include at least one lower gate electrode 130L constituting the gate of the ground selection transistor, memory gate electrodes 130M constituting a plurality of memory cells, and upper gate electrodes 130U forming gates of string select transistors. In some embodiments, the gate electrodes 230 may be disposed below the upper gate electrodes 230U and/or on the lower gate electrode 230L, and may include a gate electrode constituting an erase transistor used for an erase operation using a gate induced drain leakage (GIDL) phenomenon.

The gate electrodes 230 may be vertically spaced apart from each other and stacked on the first region R1 and the second region R2, and may extend from the first region R1 to the second region R2 at different lengths to form a step-like structure in a portion of the second region R2. The gate electrodes 230 may be disposed to have a stepped structure from each other also in the Y-direction. Due to the step structure, the upper gate electrodes 230U of the gate electrodes 230 extends longer than the lower gate electrode 230L, each of the interlayer insulating layers 225 and the gate electrodes 230 may have regions in which lower surfaces are exposed, and these regions are also referred to as "gate pad regions". A gate pad region may correspond to one region of the gate electrodes 230 positioned at the bottom of each region among the gate electrodes 230 constituting the stack structure in the second region R2 of the plate layer 210. The gate electrodes 230 may be connected to the gate contacts 260 in the gate pad regions.

The gate electrodes 230 may include a metal material, for example, tungsten (W). In some embodiments, the gate electrodes 230 may include polycrystalline silicon or a metal silicide material. In some embodiments, the gate electrodes 230 may further include a diffusion barrier, and for example, the diffusion barrier layer may include tungsten nitride (WN), tantalum nitride (TaN), titanium nitride (TiN), or combinations thereof.

The interlayer insulating layers 225 may be disposed between the gate electrodes 230. Similar to the gate electrodes 230, the interlayer insulating layers 225 may be disposed to be spaced apart from each other in a direction, perpendicular to the lower surface of the plate layer 210 and extend in the X-direction. For example, the interlayer insulating layers 225 may include an insulating material such as silicon oxide or silicon nitride.

Each of the vertical channel structures CH may have a form in which first and second channel structures CH1 and CH2 passing through the lower and upper stack structures of the gate electrodes 130 are connected, respectively, thereby having bent portions having different widths in the connection area. Each of the channel structures CH may include a channel layer 240, gate dielectric layers 245, a channel filling insulating layer 247, and a channel pad 249 disposed in the channel hole. The channel layer 240 may be formed in an annular shape surrounding the channel filling insulating layer 247, and may have other shapes such as a cylinder or a prism without the channel filling insulating layer 247. The channel layer 240 may be connected to the first horizontal conductive layer 212 at a lower portion. For example, the channel layer 240 may include a semiconductor material such as polycrystalline silicon or monocrystalline silicon.

The gate dielectric layers 245 may be disposed between the gate electrodes 230 and the channel layer 240. The gate dielectric layers 245 may extend vertically along the channel layer 240. The gate dielectric layers 245 may include a portion of a tunneling layer, a charge storage layer, and a blocking layer sequentially stacked from the channel layer 240. The tunneling layer is capable of tunneling charge into the charge storage layer, and for example, may include silicon oxide (SiO2), silicon nitride (Si3N4), silicon oxynitride (SiON), or combinations thereof. The charge storage layer may be a charge trap layer or a floating gate conductive layer. The blocking layer may include silicon oxide (SiO2), silicon nitride (Si3N4), silicon oxynitride (SiON), a high-k dielectric material, or combinations thereof.

The channel pad 249 may be disposed only at the lower end of the lower second channel structure CH2. The channel pad 249 may include, for example, doped polycrystalline silicon. The channel layer 240, the gate dielectric layers 245, and the channel filling insulating layer 247 may be connected to each other between the first channel structure CH1 and the second channel structure CH2. The interlayer insulating layers 225 having a relatively large thickness may be further disposed between the first channel structure CH1 and the second channel structure CH2.

As illustrated in FIG. 2, the first input/output contact structures 250A and second input/output contact structures 250B may be disposed to be spaced apart from the vertical channel structures CH in the X-direction. The first input/output contact structures 250A may be disposed around the gate contacts 260, and may be disposed in a region including a region between adjacent gate contacts of the gate contacts 260 in the X-direction. The first input/output contact structures 250A may pass through the plate layer 210, the horizontal insulating layer 220, the second horizontal conductive layer 214, and the gate electrodes 230 in the second region R2. The first input/output contact structures 250A may electrically connect the circuit elements 120 of the first chip structure 100 and an input/output pad. The first input/output contact structures 250A may be disposed to overlap an input/output pad in the Z-direction. In this embodiment, the second input/output contact structures 250B may electrically connect the circuit elements 120 of the first chip structure 100 and the connection pad 350 for input/output through the plate layer 210.

The connection pad 350 may be connected to the first input/output contact structures 250A, and second input/output contact structures 250B through pad vias 353. The connection pad 350 may be connected to an electrical connection structure such as a signal transmission medium of a device such as the package substrate 1100 through the upper surface of the semiconductor device 300 (refer to FIG. 3).

As described above, the protective insulating layer 310 is disposed on the upper surface of the second chip structure 200, and the protective insulating layer 310 may be formed along the side surface of the second chip structure 200 and extend to the edge region of the first chip structure 100.

As illustrated in FIG. 2, the protective insulating layer 310 may include an insulating capping layer 312 disposed on the top and side surfaces of the second chip structure 200, a passivation layer 315 disposed on the insulating capping layer 312, and a barrier insulating layer 314 is disposed between the insulating capping layer 312 and the passivation layer 315. The connection pad 350 is disposed on the insulating capping layer 312, and the passivation layer 315 and the barrier insulating layer 314 may be configured to partially open the connection pad 350. For example, the insulating capping layer 312 may include silicon oxide, and the passivation layer 315 may include polyimide or a polyimide-based material. Also, the barrier insulating layer 314 may include, for example, silicon nitride or a silicon nitride-based material.

Figure 3:
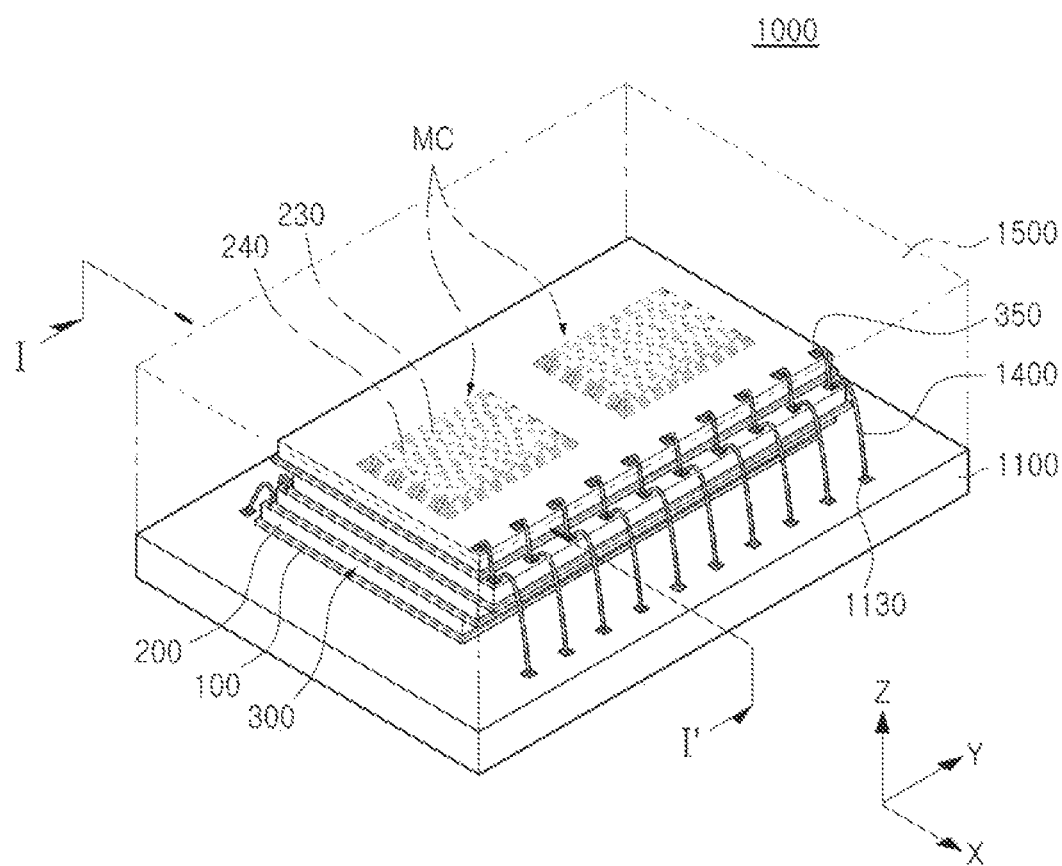
FIG. 3 is a perspective view illustrating a semiconductor package employing the semiconductor device illustrated in FIG. 1 according to an example embodiment.

FIG. 3 is a perspective view illustrating a semiconductor package employing the semiconductor device illustrated in FIG. 1 according to an example embodiment. The semiconductor package 1000 illustrated in FIG. 3 may have a structure in which four of the semiconductor device 300 are stacked. Each semiconductor device 300 may be the semiconductor devices described with reference to FIGS. 1 and 2. The cross-section of the semiconductor device cut along I-I' in FIG. 3 may be understood as the cross-section of FIG. 1, and unless otherwise specifically stated, the structure of each semiconductor device may be combined with reference to the descriptions of FIGS. 1 and 2.

Each semiconductor device 300 illustrated in FIG. 3 may include a first chip structure 100 having a peripheral circuit and a second chip structure 200 having two memory cell arrays MC arranged in the Y-direction. As described above, since the second chip structure 200 is bonded to the inner region excluding the edge region on the upper surface of the first chip structure 100, a step structure may be seen from the side of the semiconductor device 300.

The semiconductor package 1000 may include a package substrate 1100, at least one of the semiconductor device 300 on the package substrate 1100, a wire 1400 electrically connecting the at least one semiconductor device 300 and the package substrate 1100, and a molding layer 1500 covering the at least one semiconductor device 300 and the wire 1400 on the package substrate 1100. The package substrate 1100 may be a printed circuit board including package upper pads 1130. Each semiconductor device 300 may include a connection pad 350 for input/output. The semiconductor device 300 according to the present embodiment is not limited to the structure of the semiconductor package 1000 illustrated in FIG. 3, and may be employed in various other semiconductor packages.

In the above embodiments, the semiconductor device 300 is exemplified as a nonvolatile memory device in which memory cells are arranged in three dimensions, but may be applied to other memory devices such as DRAM devices or other semiconductor devices such as logic devices. For example, in the case of a DRAM device, a semiconductor device in which a first chip structure including DRAM cells and a second chip structure including peripheral circuits (or capacitors) are bonded at the wafer level may have a structure similar to that of the previous embodiment.

Figure 4:
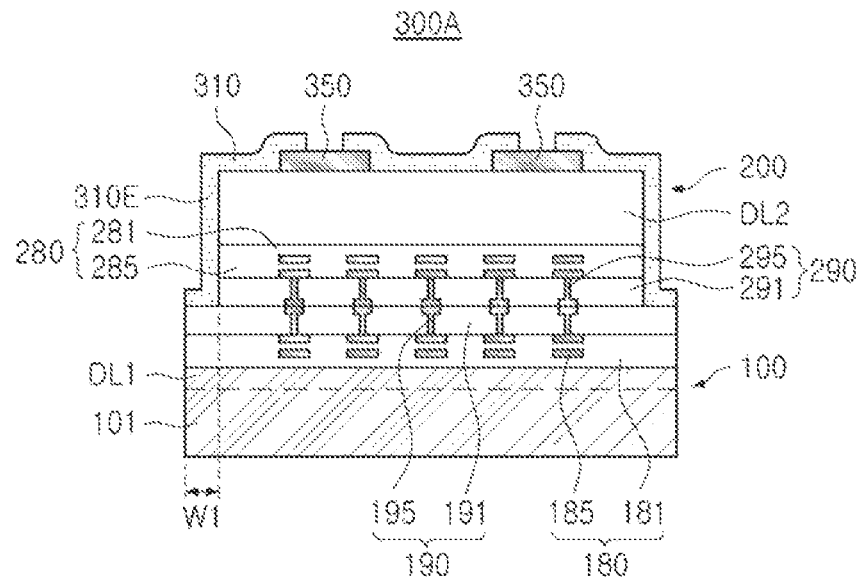
FIG. 4 is a side cross-sectional view of a semiconductor device according to an example embodiment.
Figure 5:
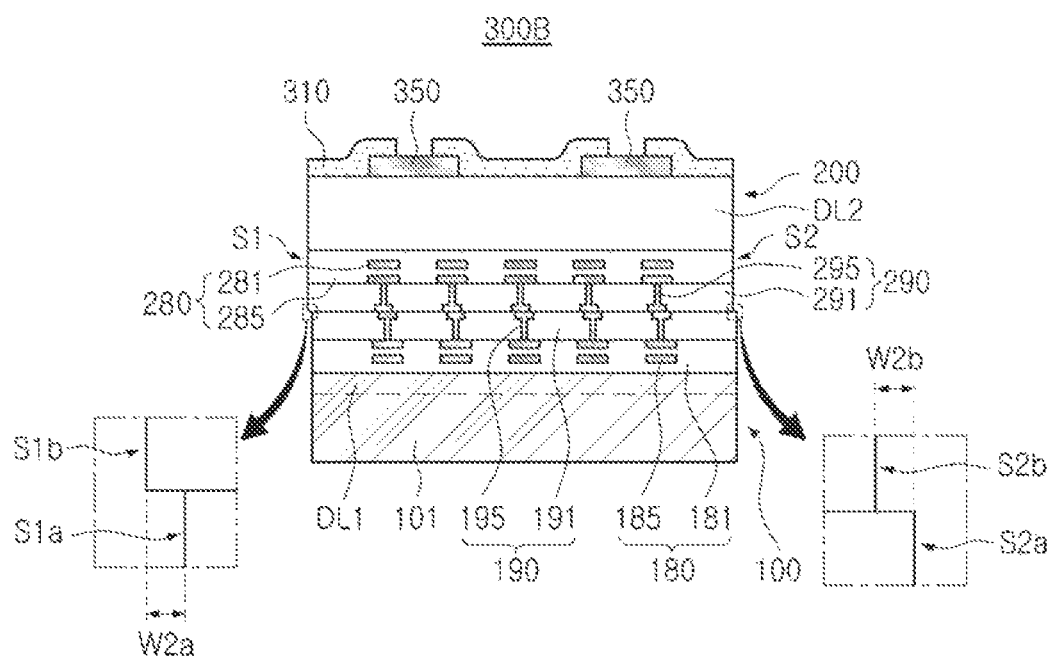
FIG. 5 is a side cross-sectional view of a semiconductor device according to an example embodiment.

FIG. 4 and FIG. 5 are side cross-sectional views of semiconductor devices according to various embodiments.

Referring to FIG. 4, a semiconductor device 300A may include a first chip structure 100, and a second chip structure 200 is disposed on an inner region of the upper surface of the first chip structure 100 except for the edge region and is bonded to the first chip structure 100, similar to the embodiment illustrated in FIG. 1. The description of the semiconductor device 300 illustrated in FIGS. 1 and 2 may be combined with the description of the semiconductor device 300A according to various embodiments unless otherwise specified.

In this embodiment, the first chip structure 100 may be a lower chip having the first device layer DL1, and the second chip structure 200 may be an upper chip having the second device layer DL2.

The first chip structure 100 may include a substrate 101, a first device layer DL1 disposed on the substrate 101, a first wiring structure 180 disposed on the first device layer DL1, and a first bonding structure 190 disposed on the first wiring structure 180. The first device layer DL1 may include first circuit elements formed on the substrate 101. The first wiring structure 180 may include a first wiring insulating layer 181, and a first wiring line 185 disposed on the first wiring insulating layer 181 and connected to first circuit elements. In addition, the first bonding structure 190 may include first bonding metal layers 195 connected to the first wiring line 185, and a first bonding insulating layer 191 disposed to surround side surfaces of the first bonding metal layers 195. The edge region of the upper surface of the first chip structure 100 may be provided by the first bonding structure 190, in particular, the upper surface of the first bonding insulating layer 191.

The width of the edge region may have a width ranging from 5 μm to 50 μm, and may be determined by a cutting width of a cutting process to obtain the first chip structure 100. For example, the width of the edge region may be approximately ½ of the cut width.

As described above, the second chip structure 200 is disposed on an inner region of the upper surface of the first chip structure 100 excluding the edge region. The second chip structure 200 may include a second bonding structure 290 bonded to the first bonding structure 190, a second wiring structure 280 disposed on the second bonding structure 290, and a second device layer DL2 disposed on the second wiring structure 280 and having second circuit elements. The second bonding structure 290 may include second bonding metal layers 295 respectively bonded to the first bonding metal layers 195, and a second bonding insulating layer 291 surrounding the side surfaces of the second bonding metal layers 295 and bonded to the first bonding insulating layer 191. The second wiring structure 280 may include a second wiring insulating layer 281 and the second wiring lines 285. The second wiring structure 280 may be configured to electrically connect the second bonding metal layers 295 and second circuit elements.

The substrate used to form the second device layer DL2 employed in this embodiment is removed after bonding with the first chip structure 100 at the wafer level (refer to FIG. 9), and a protective insulating layer 310 may be disposed on the removed surface of the second chip structure 200. A plurality of the connection pad 350 may be disposed on the protective insulating layer 310 and may be electrically connected to the second circuit elements through pad vias or the like. As illustrated in FIG. 4, the protective insulating layer 310 is disposed on the upper surface of the second chip structure 200, and may have a portion formed along the side surface of the second chip structure 200 and extending to the edge region of the first chip structure 100.

In this embodiment, the protective insulating layer 310 may have a portion 310E extending to the edge region of the first chip structure 100 along the side surface of the second chip structure 200. The extended portion 300E of the protective insulating layer 310 may extend to an edge region of the first chip structure 100 along a side surface of the second chip structure 200.

Referring to FIG. 5, a semiconductor device 300B according to an example embodiment may be understood as a structure similar to that of the semiconductor device 300 and semiconductor device 300A illustrated in FIGS. 1, 2, and 4, except that the second chip structure 200 has an area corresponding to the size of the first chip structure 100, the side surface of the first chip structure 100 and the side surface of the second chip structure 200 are offset from both sides S1 and S2 and the formation position of the protective insulating layer 310 is different. Accordingly, the description of the semiconductor device 300 and semiconductor device 300A illustrated in FIGS. 1, 2, and 4 may be combined with the description of the semiconductor device 300B according to the present embodiment unless otherwise specified.

The first chip structure 100 may include a substrate 101, a first device layer DL1 disposed on the substrate 101, a first wiring structure 180 disposed on the first device layer DL1, and a first bonding structure 190 disposed on the first wiring structure 180.

In various embodiments, the second chip structure 200 is disposed on almost the entire upper surface of the first chip structure 100. The second chip structure 200 may include a second bonding structure 290 bonded to the first bonding structure 190, a second wiring structure 280 disposed on the second bonding structure 290, and a second device layer DL2 disposed on the second wiring structure 280 and having second circuit elements. In this embodiment, the second chip structure 200 may have an area corresponding to the size of the first chip structure 100, and at least one side of the side surfaces of the first chip structure 100 may be offset from a corresponding side of the side surfaces of the second chip structure 200. The offset interval may be smaller than the width of the edge region in the previous embodiment. For example, the offset spacing (W2a, W2b) may range from 0.5 µm to 5 µm (e.g., 3 µm or less).

In the present example embodiment, side surfaces of the first chip structure 100 and second chip structure 200 may be offset from each other on opposite side surfaces S1 and S2 of the semiconductor device 300B. As illustrated in FIG. 5, in one (S1) of both sides facing the semiconductor device 300B, the side surface Sla of the first chip structure 100 is the side surface (Sla) of the second chip structure. Offset to protrude from S1b), the other one S2 of opposite sides of the semiconductor device 300B may have a side surface of the second chip structure more protruding than a side surface of the first chip structure.

In various embodiments (e.g., FIGS. 13-15), a cutting process with a small cut width (e.g., laser stealth dicing) is used, and the cutting process of the second chip structure is performed before bonding, and the cutting process for the first chip structure is performed after bonding, and therefore, it may be understood as a fine offset interval that is generated by changing the location of the cutting line (e.g., cracks). The offset intervals W2a and W2b may almost correspond, but in various embodiments, there may be a slight difference depending on the propagation path of the crack.

A protective insulating layer 310 is disposed on the upper surface of the second chip structure 200, and a plurality of the connection pad 350 may be formed on the protective insulating layer 310 to be electrically connected to second circuit elements of the second device layer DL2. In various embodiments, in the manufacturing process of the semiconductor device 300B, since the cut width Kf of the second chip structure 200 is very small (see FIG. 14), the protective insulating layer 310 may be formed only on the upper surface of the second chip structure 200 and may not extend along the side surface of the second chip structure 200.

In this embodiment, an offset form is exemplified only on some side surfaces S1 and S2 of the semiconductor device 300B. On all sides of the semiconductor device 300B, for example all four sides, side surfaces of the first chip structure 100 and second chip structure 200 may be offset from each other, and the protrusion shapes may be opposite to each other as described in FIG. 4 at both sides facing each other.

Hereinafter, various embodiments of the method of manufacturing a semiconductor device according to the present embodiment will be described.

FIGS. 6-10 are cross-sectional views for illustrating methods of manufacturing the semiconductor device illustrated in FIGS. 1-2 and FIGS. 4-5.

Figure 6:
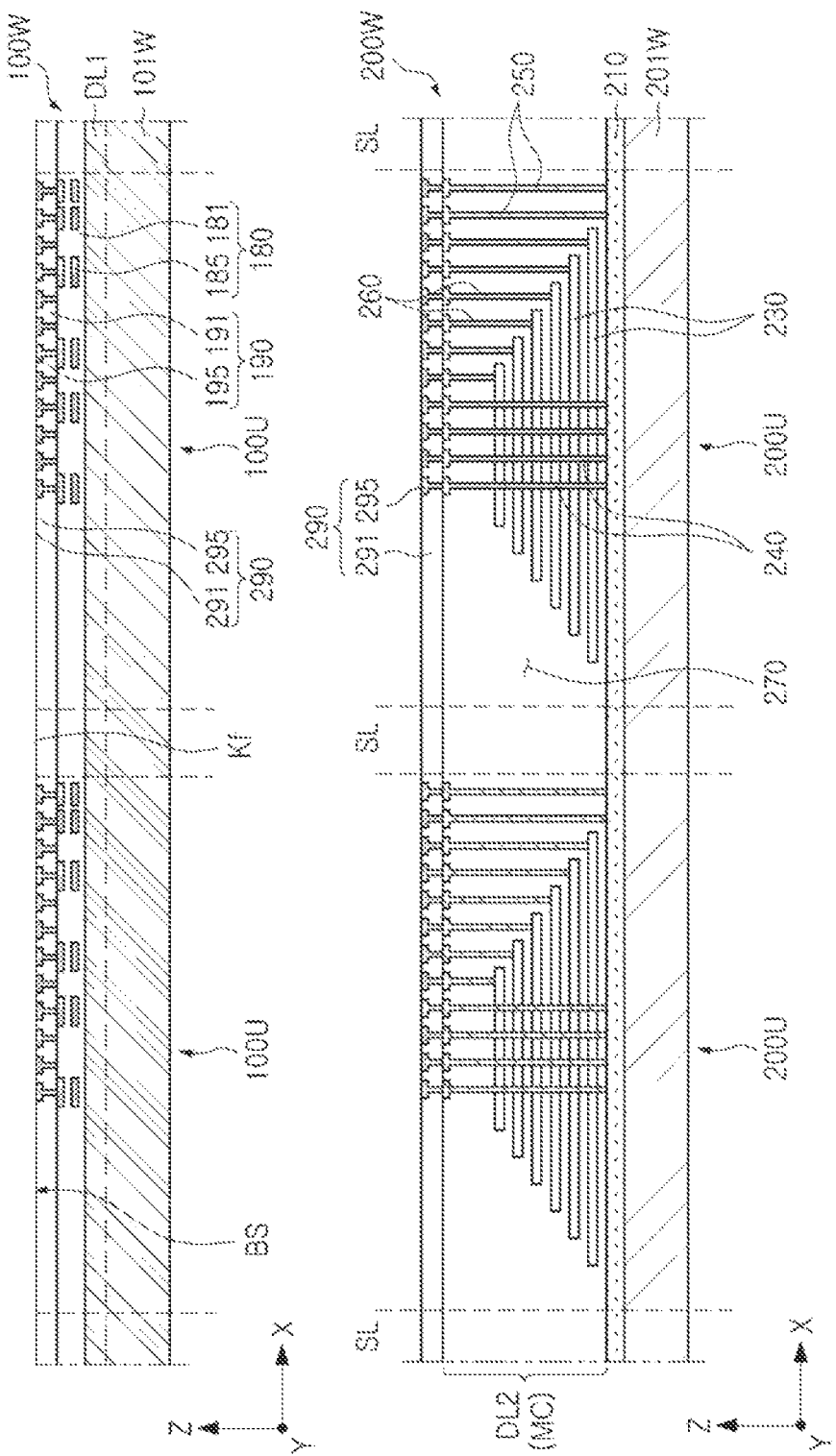
FIG. 6 is a cross-sectional view of a semiconductor device illustrating a method of manufacturing the semiconductor device according to an example embodiment.

Referring to FIG. 6, a first substrate structure 100W and a second substrate structure 200W are prepared.

The first substrate structure 100W is divided into a plurality of first chip regions 100U, and each of the first chip regions 100U may serve as a lower chip for a peripheral circuit. The first substrate structure 100W may be provided by forming a first device layer DL1 on the first wafer 101W, forming the first wiring structure 180 on the first device layer DL1 and a first bonding metal layer on the first wiring structure 180, and performing the process of forming the first bonding structure 190 having the first bonding insulating layer 191 surrounding the first bonding vias 193 and the first bonding metal layers 195.

The second substrate structure 200W may be divided into a plurality of second chip regions 200U respectively corresponding to the plurality of first chip regions 100U. Each of the plurality of second chip regions 200U may include the memory cell array MC described with reference to FIG. 2.

Similar to the manufacturing process of the first substrate structure 100W, the second substrate structure 200W may be provided by forming a second device layer DL2 on the second wafer 201W, forming a second bonding structure 290 having second bonding metal layers 295 and a second bonding insulating layer 291 surrounding the second bonding metal layers 295 on the second device layer DL2. Although not illustrated in the present embodiment, an additional wiring structure (refer to 280 of FIG. 2) having a cell contact plug or wiring line may be disposed between the second device layer DL2 and the second bonding structure 290.

Figure 11:
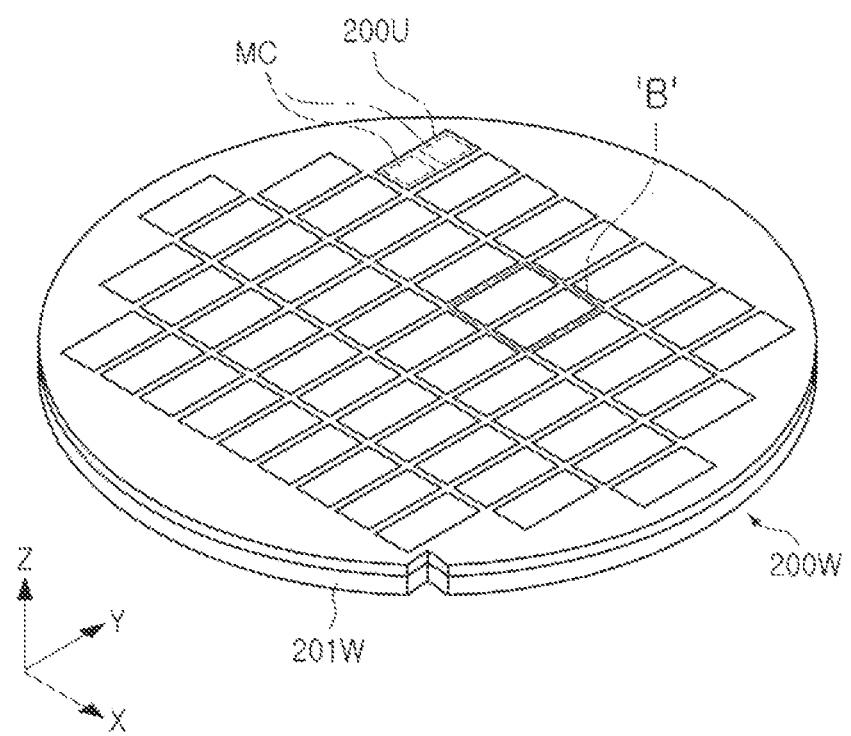
FIG. 11 is a plan view illustrating a second substrate structure according to an example embodiment.
Figure 12:
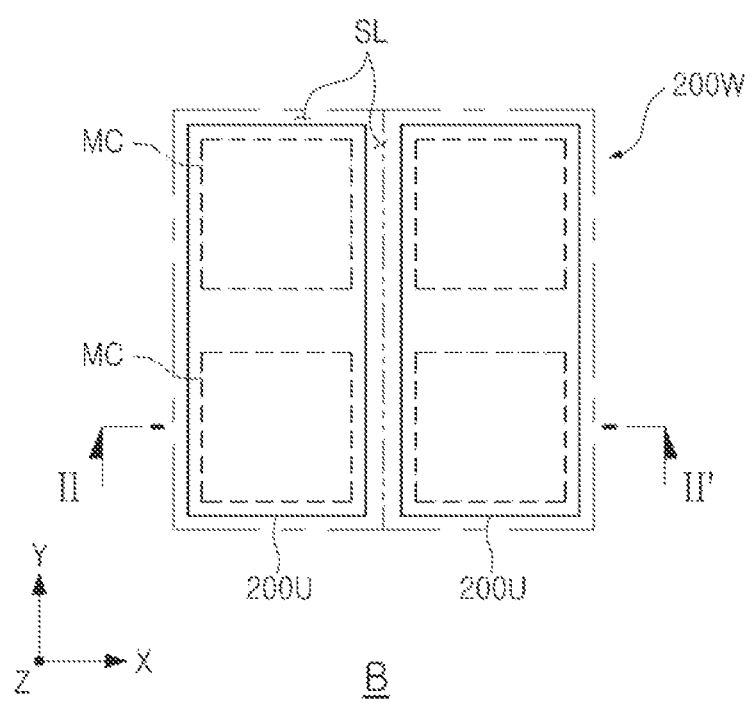
FIG. 12 is a partially enlarged view illustrating a portion ("B") of the second substrate structure illustrated in FIG. 11 according to an example embodiment.

FIG. 11 is a plan view illustrating a second substrate structure 200W to which the cutting process illustrated in FIG. 6 is applied, and FIG. 12 is an enlarged view of a portion illustrating a portion ("B") of the second substrate structure 200W illustrated in FIG. 11.

The second substrate structure 200W may include a plurality of second chip regions 200U arranged in the X and Y-directions on the second wafer 201W, as illustrated in FIGS. 11 and 12. As described in FIG. 3, each of the second chip regions 200U may have two memory cell arrays MC arranged in the Y-direction, and may be distinguished by a scribe lane SL.

Figure 7:
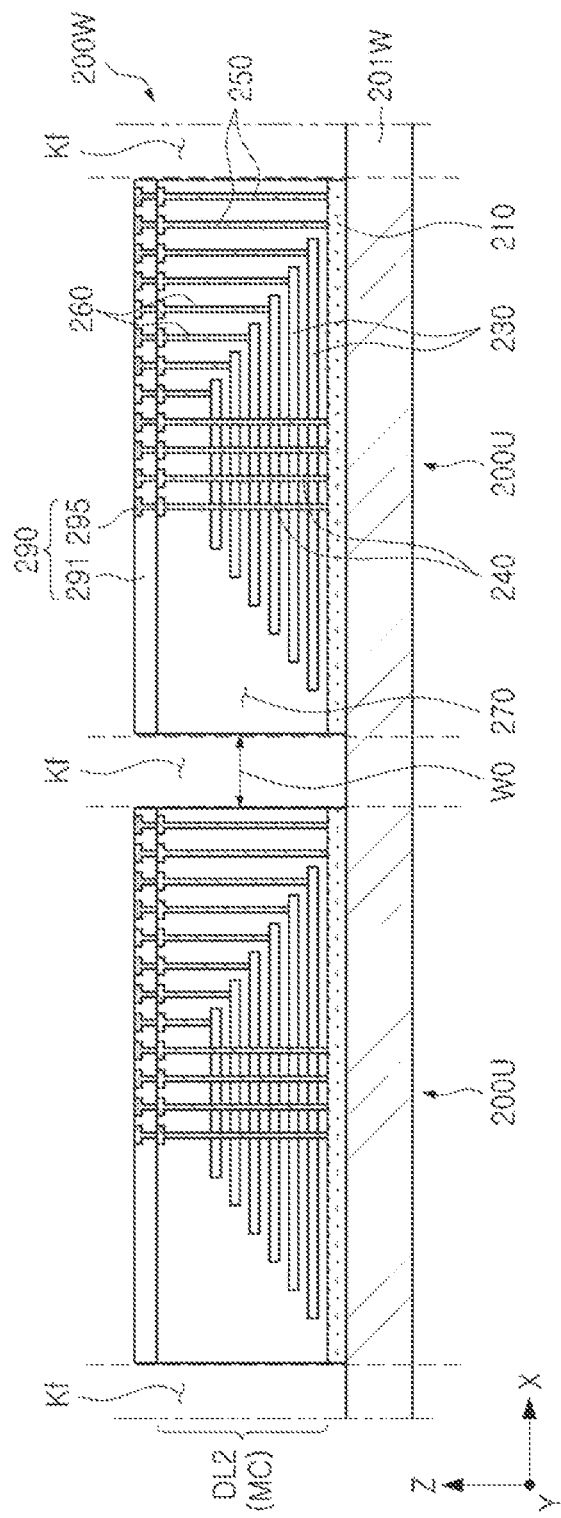
FIG. 7 is a cross-sectional view of a semiconductor device illustrating a method of manufacturing the semiconductor device according to an example embodiment.

Referring to FIG. 7, the second substrate structure 200W may be partially separated into the plurality of second chip regions 200U.

This partial separation process is performed before the bonding process of the first substrate structure 100W and second substrate structure 200W. This process may be performed as a process of cutting the second bonding structure 290, the second wiring structure 280, and the second device layer DL. Even after the separation process, the plurality of second chip regions 200U separated on the second wafer 201W may be maintained.

The cut width Kf obtained by this partial separation process, for example, the width Kf of the cut area between the plurality of second chip regions 200U, may be in the range of 10 μm to 100 μm. For example, this separation process may be performed by dicing using a blade having a predetermined width, or dicing using a laser and/or chemical etching accompanied by removal of a predetermined width region.

Figure 8:
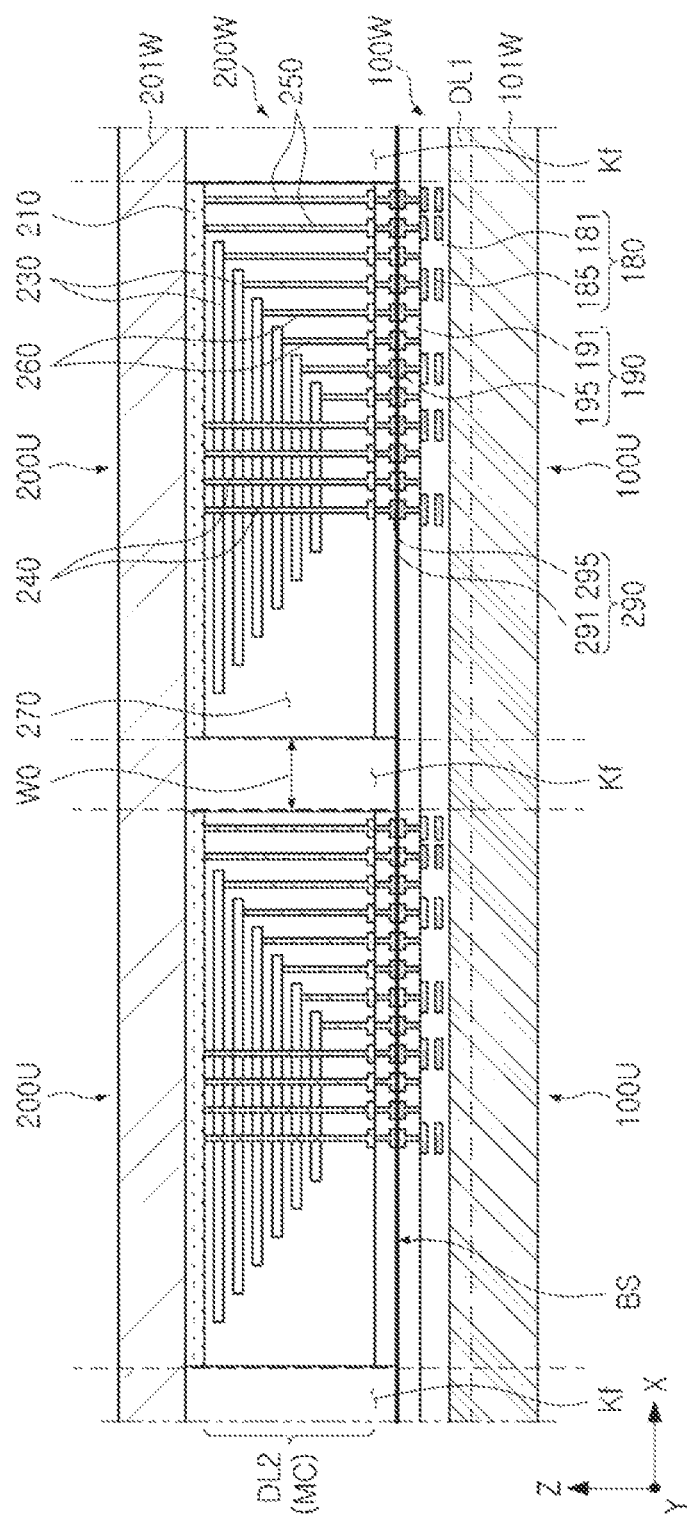
FIG. 8 is a cross-sectional view of a semiconductor device illustrating a method of manufacturing the semiconductor device according to an example embodiment.

Referring to FIG. 8, the second substrate structure 200W is bonded to the first substrate structure 100W.

The present bonding process may be performed by a hybrid bonding process, as described above. By heating in a state in which the second bonding metal layers 295 and the second bonding insulating layer 291 are bonded to the first bonding metal layers 195 and the first bonding insulating layer 191 under a constant pressure, respectively. The first substrate structure 100W and the second substrate structure 200W may be bonded to each other. As illustrated in FIG. 8, the second chip regions 200U of the second substrate structure 200W may be bonded to the first substrate structure 100W in a substantially separated state.

Figure 9:
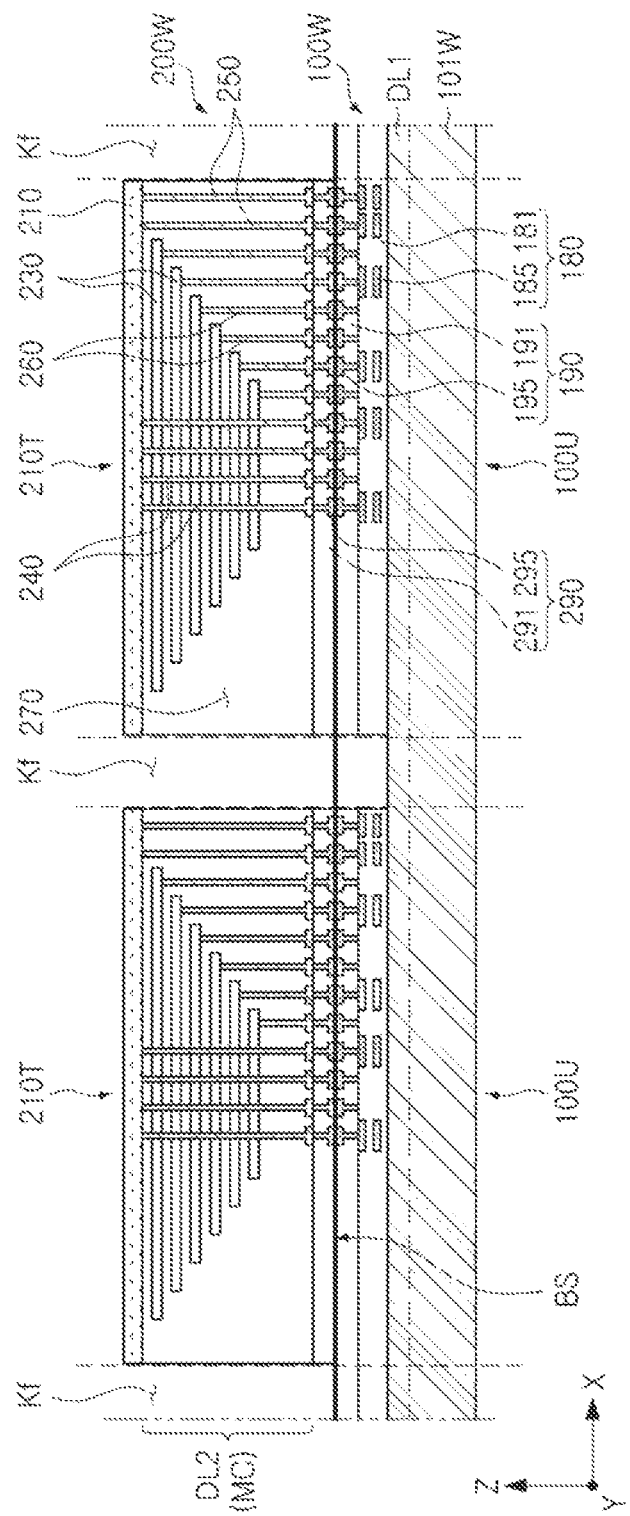
FIG. 9 is a cross-sectional view of a semiconductor device illustrating a method of manufacturing the semiconductor device according to an example embodiment.

Referring to FIG. 9, the second wafer 201W is removed from the second substrate structure 200W.

The semiconductor device 300 according to the present embodiment may require a pad forming process for external connection. As a method for forming the pad, as in the present process, the second wafer 201W may be removed to expose the surface of the second device layer DL2. In this embodiment, the upper surface 210T of the plate layer 210 may be exposed. This process may be performed using chemical-mechanical polishing (CMP) or a grinding process.

Figure 10:
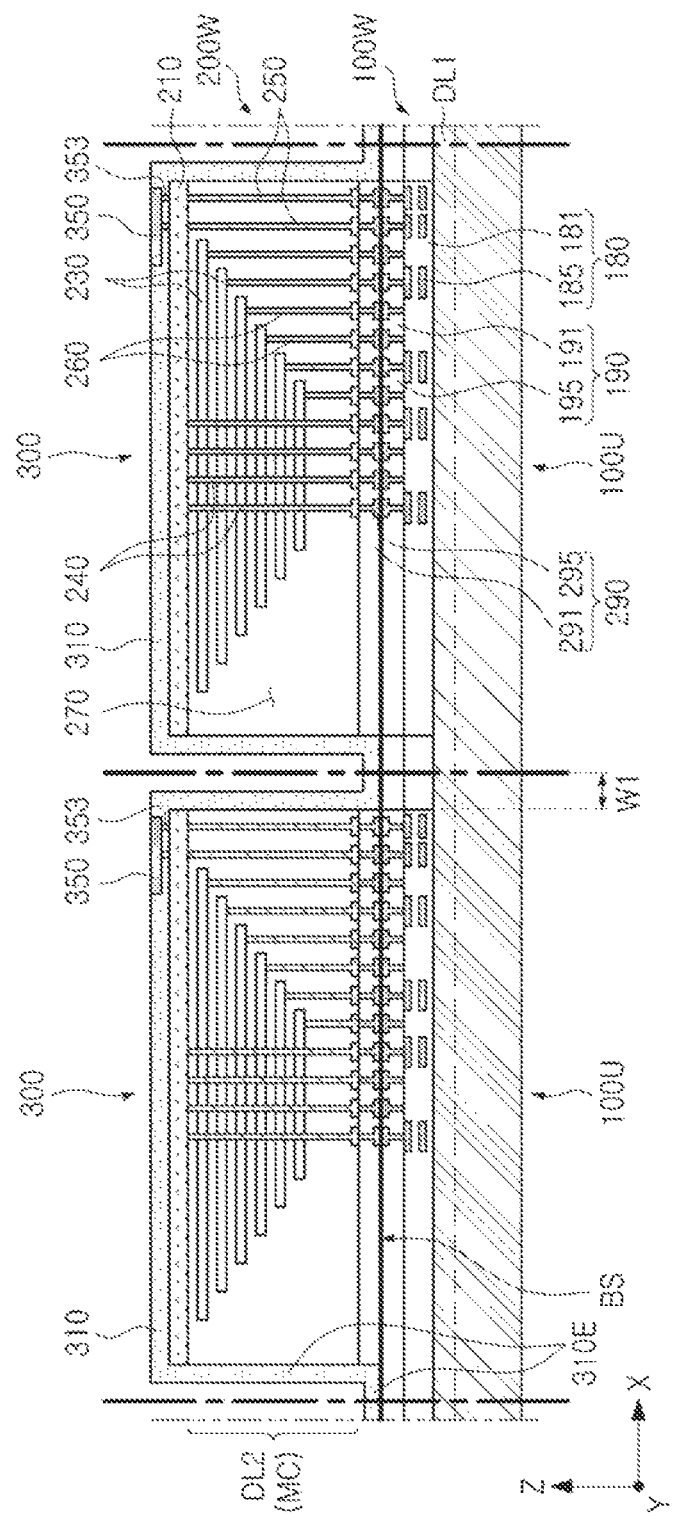
FIG. 10 is a cross-sectional view of a semiconductor device illustrating a method of manufacturing the semiconductor device according to an example embodiment.

Referring to FIG. 10, the connection pad 350 and the protective insulating layer 310 are formed on the exposed surface of the second device layer DL2. Next, the semiconductor device 300 may be manufactured by separating the first substrate structure 100W into the plurality of first chip regions 100U.

A protective insulating layer 310 may be formed on the exposed surface of the second device layer DL. The protective insulating layer 310 may have a portion 310E formed on the exposed side surfaces of the plurality of second chip regions 200U exposed by the cut regions and the exposed upper surfaces of the plurality of first chip regions 100U.

In various embodiments, the protective insulating layer 310 may include an insulating capping layer, a barrier insulating layer, and a passivation layer. For example, an insulating capping layer is formed on the exposed surface of the second device layer DL, and a connection pad 350 electrically connected to the second device layer DL2 is formed. The connection pad 350 may pass through the insulating capping layer through the pad via and may be electrically connected to the circuit elements of the second device layer DL2 (the second wiring lines 285 and second bonding metal layers 295). Then, a barrier insulating film and a passivation layer are formed on the insulating capping layer, and the barrier insulating layer and the passivation layer may be partially removed such that a partial region of the connection pad 350 is opened. For example, the insulating capping layer comprises silicon oxide, and the passivation layer may include polyimide or a polyimide-based material. In addition, the barrier insulating layer may include, for example, silicon nitride or a silicon nitride-based material.

The separation process of the first substrate structure 100W for final cutting may be performed by laser stealth dicing, and after being cut, the edge region of the upper surface of the first chip structure 100 is a region to which the second chip structure 200 is not bonded, and may be covered by the protective insulating layer 310.

In various embodiments, the semiconductor device 300B illustrated in FIG. 5 may be manufactured by processes in which a partial separation process of the second substrate structure is performed as a dicing process having a small cut width.

Figure 13:
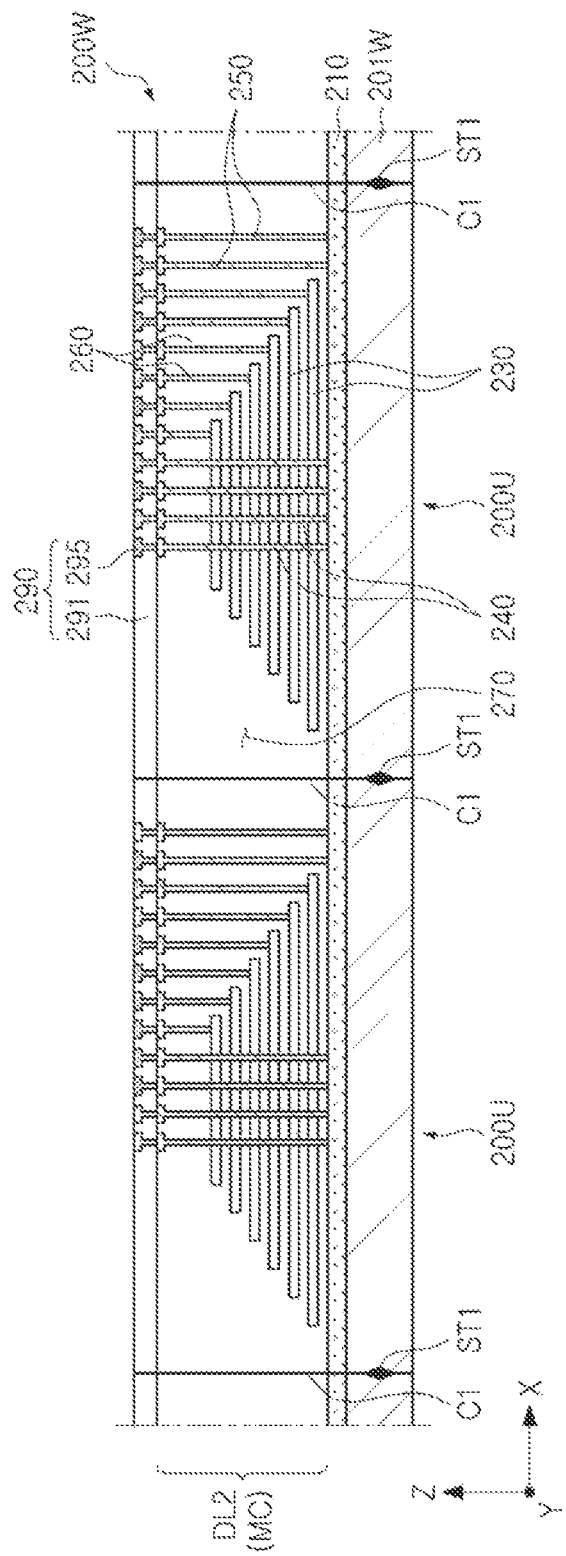
FIG. 13 is a cross-sectional view of a semiconductor device illustrating a method of manufacturing the semiconductor device according to an example embodiment.
Figure 14:
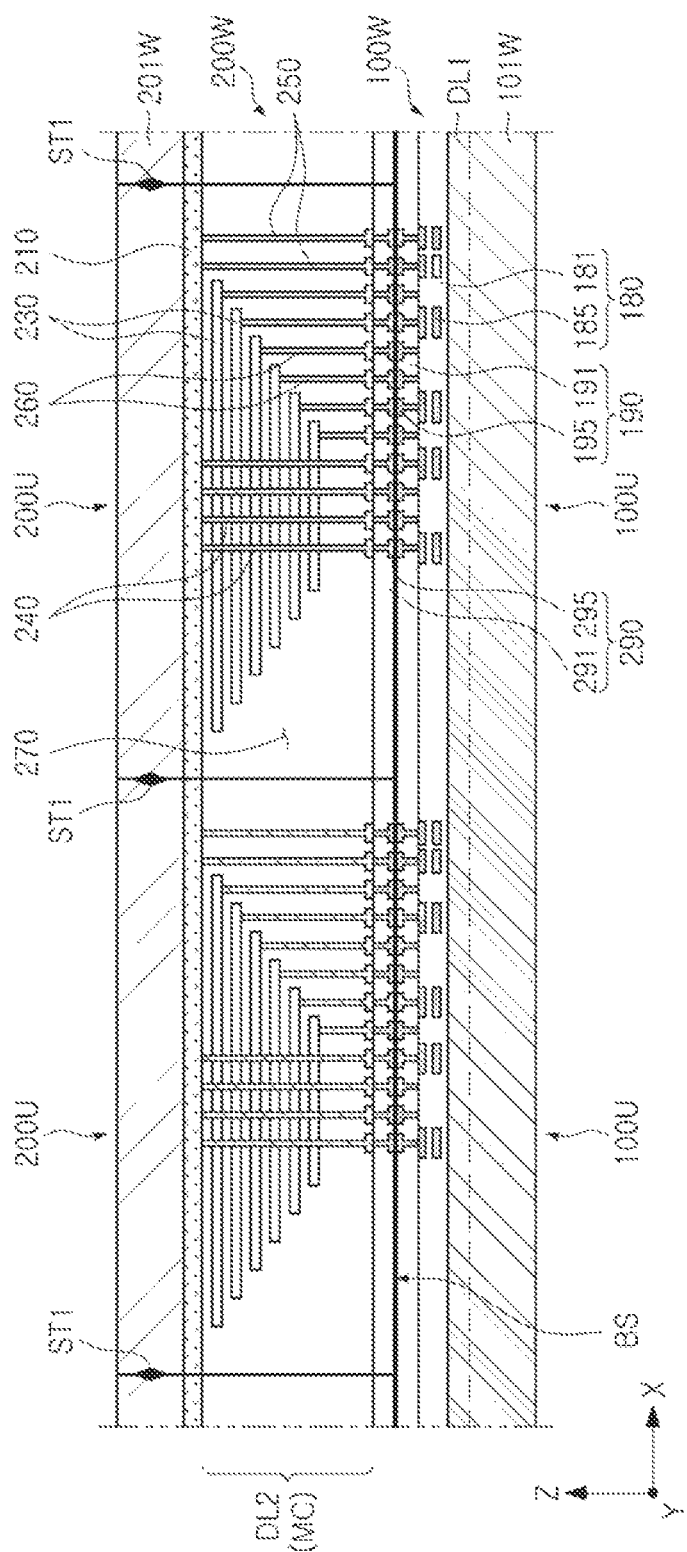
FIG. 14 is a cross-sectional view of a semiconductor device illustrating a method of manufacturing the semiconductor device according to an example embodiment.
Figure 15:
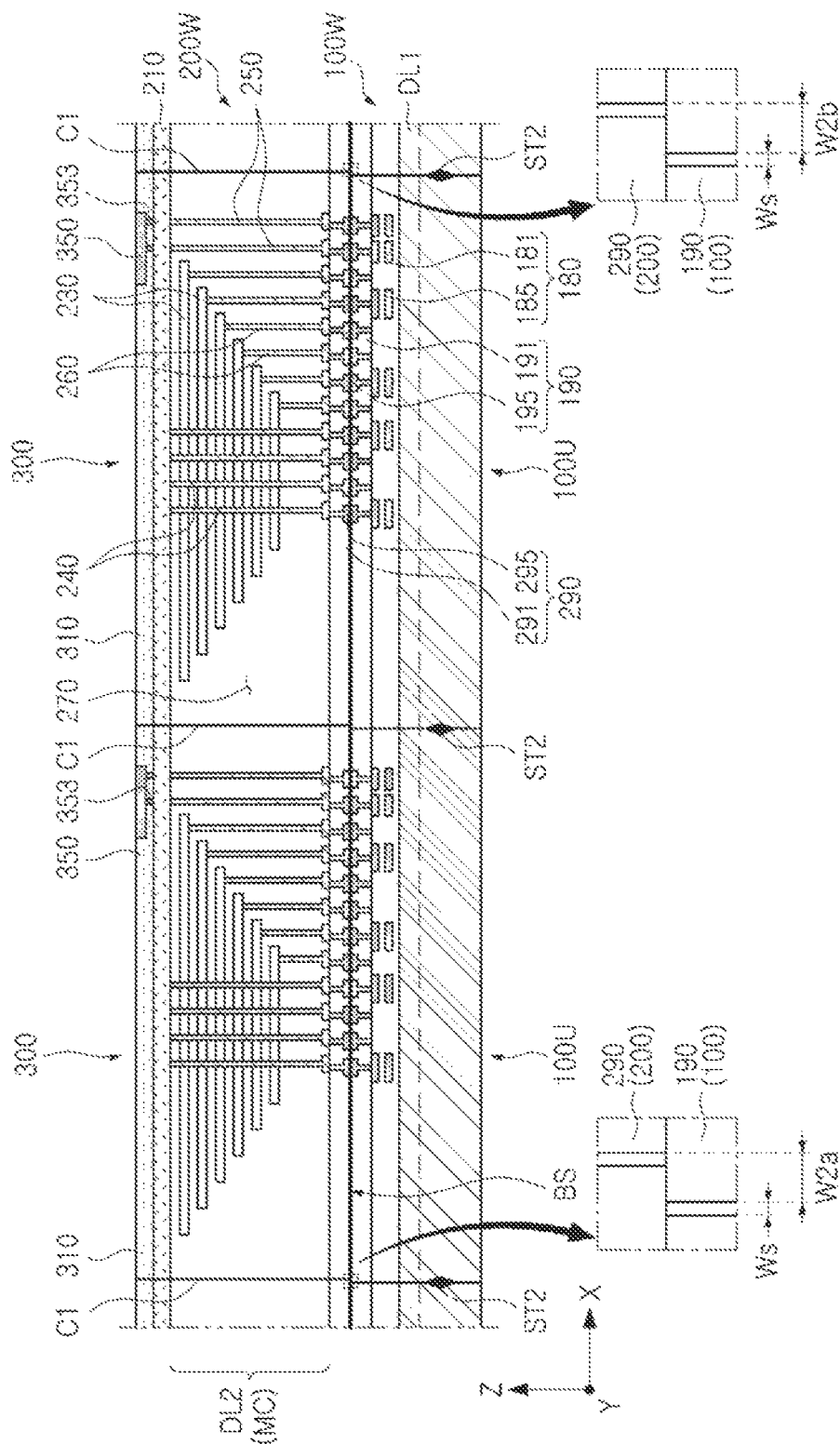
FIG. 15 is a cross-sectional view of a semiconductor device illustrating a method of manufacturing the semiconductor device according to an example embodiment.

FIGS. 13 to 15 are cross-sectional views illustrating a method of manufacturing a semiconductor device according to example embodiments.

Referring to FIG. 13, the second substrate structure 200W may be partially separated into a plurality of second chip regions 200U.

This process may be understood as a subsequent process using the first substrate structure 100W and second substrate structure 200W illustrated in FIG. 6. This partial separation process is performed before the bonding process of the first substrate structure 100W and second substrate structure 200W.

The cut width Kf obtained by this partial separation process, for example, the width Kf of the cut region between the plurality of second chip regions 200U, may be 10 μm or less (e.g., 5 μm or less). For example, the process may be performed by laser stealth dicing. In detail, after the laser beam is focused on a predetermined area of the second wafer 201W located below the scribe lane to be melted; by generating cracks in the vertical direction (e.g., thickness direction) of the second substrate structure 200W, a separation process may be performed. Since it is not the state being completely separated even after the separation process, the plurality of second chip regions 200U separated on the second wafer 201W may be maintained. In various embodiments, a separate bonding tape may be attached to the surface of the second wafer 201W such that the plurality of second chip regions 200U are not completely separated.

Referring to FIG. 14, the second substrate structure 200W is bonded to the first substrate structure 100W, and the second wafer 201W may be removed from the second substrate structure 200W.

The present bonding process may be performed by a hybrid bonding process, as described above. By heating in a state in which the second bonding metal layers 295 and the second bonding insulating layer 291 are bonded to the first bonding metal layers 195 and the first bonding insulating layer 191 under a constant pressure, respectively. The first substrate structure 100W and the second substrate structure 200W may be bonded to each other. The surface of the second device layer DL2 may be exposed by removing the second wafer 201W. In this embodiment, the upper surface 210T of the plate layer 210 may be exposed. This process may be performed using a CMP or grinding process.

Referring to FIG. 15, the connection pad 350 and the protective insulating layer 310 are formed on the exposed surface of the second device layer DL2. Then, a semiconductor device may be manufactured by separating the first substrate structure 100W into the plurality of first chip regions 100U.

A protective insulating layer 310 may be formed on the exposed surface of the second device layer DL. The protective insulating layer 310 may have a portion 310E formed on the exposed side surfaces of the plurality of second chip regions 200U exposed by the cut regions and the exposed upper surfaces of the plurality of first chip regions 100U. In various embodiments, the protective insulating layer 310 may include an insulating capping layer, a barrier insulating layer, and a passivation layer.

The separation process of the first substrate structure 100W for final cutting may be performed by laser stealth dicing, and the cutting width (Ws) by this process may be 10 μm or less, similar to the previous partial separation process. In at least one side surface of the semiconductor device manufactured by the present process, the first chip regions 100U may be offset from a corresponding side surface among side surfaces of the second chip regions 200U.

As such, in this embodiment, since the cutting process of the second substrate structure 200W is performed before bonding and the cutting process for the first substrate structure 100W is performed after bonding, fine offset intervals W2a and W2b that are generated by changing the positions of the cutting lines (e.g., cracks) may be generated. The offset intervals W2a and W2b may almost correspond to each other, but in various embodiments, there may be a slight difference depending on the propagation path of the crack. For example, the offset spacing (W2a, W2b) may range from 0.5 μm to 5 μm, especially 3 μm or less.

As set forth above, in the case of the example embodiment performed after the first substrate structure (e.g., peripheral circuit wafer) and the second substrate structure (e.g., memory cell wafer) are bonded, the separation process of the second substrate structure may be performed in advance, thereby preventing a problem of false crack propagation along a relatively weak bonding interface, and accordingly, occurrence of defects in the cutting process may be significantly reduced.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
 a first chip structure comprising:
  a substrate,
  circuit elements disposed on the substrate,
  a wiring structure disposed on the circuit elements,
  first bonding metal layers disposed on the wiring structure, and
  a first bonding insulating layer disposed on the wiring structure and surrounding side surfaces of the first bonding metal layers, an upper surface of the first chip structure having an edge region and an inner region surrounded by the edge region;
 a second chip structure disposed on the inner region of the upper surface of the first chip structure, the second chip structure comprising:
  second bonding metal layers respectively bonded to the first bonding metal layers,
  a second bonding insulating layer surrounding side surfaces of the second bonding metal layers and bonded to the first bonding insulating layer, and
  a memory cell layer disposed on the second bonding metal layers and the second bonding insulating layer, and comprising memory cells;
 an insulating capping layer disposed on an upper surface of the second chip structure and extending to the edge region of the first chip structure along a side surface of the second chip structure; and
 a connection pad disposed on a region of the insulating capping layer on the upper surface of the second chip structure, and electrically connected to the memory cells.

2. The semiconductor device of claim 1, wherein the edge region of the first chip structure has a width in a range of 5 μm to 50 μm.

3. The semiconductor device of claim 1, wherein the edge region of the first chip structure has a width in a range of 10 μm to 30 μm.

4. The semiconductor device of claim 1, further comprising a passivation layer disposed on the insulating capping layer and exposing the connection pad.

5. The semiconductor device of claim 4, wherein the passivation layer has an extended portion extending to the edge region of the first chip structure along the side surface of the second chip structure.

6. The semiconductor device of claim 5, wherein the extended portion of the passivation layer comprises a first portion extending in a first direction, perpendicular to the upper surface of the first chip structure along the side surface of the second chip structure, and a second portion extending in a second direction, parallel to the upper surface of the first chip structure along the edge region of the first chip structure.

7. The semiconductor device of claim 4, wherein the insulating capping layer comprises silicon oxide, and
 the passivation layer comprises polyimide or a polyimide-based material.

8. The semiconductor device of claim 4, further comprising a barrier insulating layer disposed between the insulating capping layer and the passivation layer.

9. The semiconductor device of claim 8, wherein the barrier insulating layer has a portion extending to the edge region of the first chip structure along the side surface of the second chip structure.

10. The semiconductor device of claim 8, wherein the barrier insulating layer comprises silicon nitride or a silicon nitride-based material.

11. The semiconductor device of claim 1, wherein the memory cell layer comprises:
- a plate layer electrically connected to the connection pad;
- gate electrodes stacked on a lower surface of the plate layer, spaced apart from each other in a first direction, perpendicular to the lower surface of the plate layer, and electrically connected to the second bonding metal layers; and
- vertical channel structures passing through the gate electrodes, extending in the first direction, and electrically connected to the second bonding metal layers.

12. A semiconductor device comprising:
- a first chip structure comprising:
  - a substrate,
  - a first device layer disposed on the substrate and having first circuit elements,
  - a first wiring structure disposed on the first device layer,
  - first bonding metal layers disposed on the first wiring structure, and
  - a first bonding insulating layer disposed on the first wiring structure and surrounding side surfaces of the first bonding metal layers, an upper surface of the first chip structure having an edge region having a width in a range of 5 μm to 50 μm and an inner region surrounded by the edge region;
- a second chip structure disposed on the inner region of the upper surface of the first chip structure, the second chip structure comprising:
  - second bonding metal layers respectively bonded to the first bonding metal layers,
  - a second bonding insulating layer surrounding side surfaces of the second bonding metal layers and bonded to the first bonding insulating layer,
  - a second wiring structure disposed on the second bonding metal layers and the second bonding insulating layer, and
  - a second device layer disposed on the second wiring structure and having second circuit elements;
- a protective insulating layer disposed on an upper surface of the second chip structure and having an extended portion extending to the edge region of the first chip structure along a side surface of the second chip structure; and
- a connection pad disposed in a region of the protective insulating layer located on the upper surface of the second chip structure, the connection pad being electrically connected to the second circuit elements.

13. The semiconductor device of claim 12, wherein the extended portion of the protective insulating layer comprises:
- a first portion extending in a direction, perpendicular to the upper surface of the first chip structure along the side surface of the second chip structure; and
- a second portion extending in a direction, parallel to the upper surface of the first chip structure along the edge region of the first chip structure.

14. The semiconductor device of claim 12, wherein the protective insulating layer comprises:
- an insulating capping layer disposed on the upper surface and the side surface of the second chip structure and on which the connection pad is disposed;
- a passivation layer disposed on the insulating capping layer and exposing a portion of the connection pad; and
- a barrier insulating layer disposed between the insulating capping layer and the passivation layer.

15. The semiconductor device of claim 12, wherein a thickness of the protective insulating layer is less than a width of the edge region.

16. A semiconductor device comprising:
- a first chip structure comprising:
  - a substrate,
  - circuit elements disposed on the substrate,
  - a wiring structure disposed on the circuit elements,
  - first bonding metal layers disposed on the wiring structure, and
  - a first bonding insulating layer disposed on the wiring structure and surrounding side surfaces of the first bonding metal layers;
- a second chip structure disposed on an upper surface of the first chip structure, the second chip structure comprising:
  - second bonding metal layers respectively bonded to the first bonding metal layers,
  - a second bonding insulating layer surrounding side surfaces of the second bonding metal layers and bonded to the first bonding insulating layer, and
  - a memory cell layer disposed on the second bonding metal layers and the second bonding insulating layer and having memory cells;
- an insulating capping layer disposed on an upper surface of the second chip structure; and
- a connection pad disposed on a region of the insulating capping layer and electrically connected to the memory cells,
- wherein at least one side of side surfaces of the first chip structure is offset from a corresponding side of side surfaces of the second chip structure.

17. The semiconductor device of claim 16, wherein an offset interval between the at least one side of the side surfaces of the first chip structure and the corresponding side is in a range of 0.5 μm to 5 μm.

18. The semiconductor device of claim 16, wherein in both opposing side surfaces of the semiconductor device, side surfaces of the first chip structure and the second chip structure are offset from each other.

19. The semiconductor device of claim 18, wherein one of the opposing side surfaces of the semiconductor device is offset such that the first chip structure protrudes further than the second chip structure, and the other of the opposing side surfaces of the semiconductor device is offset such that the second chip structure protrudes further than the first chip structure.

20. The semiconductor device of claim 16, wherein the semiconductor device has four side surfaces, and side surfaces of the first and second chip structures in the four side surfaces are offset from each other.

* * * * *